(12) United States Patent
Ando et al.

(10) Patent No.: US 9,761,661 B2
(45) Date of Patent: Sep. 12, 2017

(54) STACKED STRAINED AND STRAIN-RELAXED HEXAGONAL NANOWIRES

(71) Applicant: INTERNATIONAL BUSINESS MACHINES CORPORATION, Armonk, NY (US)

(72) Inventors: Takashi Ando, Tuckahoe, NY (US); Pouya Hashemi, White Plains, NY (US); John A. Ott, Greenwood Lake, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/249,560

(22) Filed: Aug. 29, 2016

(65) Prior Publication Data
US 2017/0117361 A1   Apr. 27, 2017

Related U.S. Application Data

(62) Division of application No. 14/921,164, filed on Oct. 23, 2015, now Pat. No. 9,496,263.

(51) Int. Cl.
*H01L 27/12* (2006.01)
*H01L 29/06* (2006.01)
(Continued)

(52) U.S. Cl.
CPC ........ *H01L 29/0673* (2013.01); *H01L 29/045* (2013.01); *H01L 29/1054* (2013.01); *H01L 29/16* (2013.01); *H01L 29/785* (2013.01)

(58) Field of Classification Search
CPC . B82Y 10/00; H01L 29/775; H01L 29/42392; H01L 29/66439; H01L 21/02603; H01L 29/0669; H01L 29/0673
See application file for complete search history.

(56) References Cited

U.S. PATENT DOCUMENTS

| 7,642,177 B2 | 1/2010 | Cho |
| 7,659,200 B2 | 2/2010 | Cohen et al. |

(Continued)

FOREIGN PATENT DOCUMENTS

DE   19522054 C1   11/1996

OTHER PUBLICATIONS

Kwong, Vertical Silicon Nanowire Platform for Low Power Electronics and Clean Energy Applications, J. Nanotech. vol. 2012.*

(Continued)

*Primary Examiner* — Charles Garber
*Assistant Examiner* — Syed Gheyas
(74) *Attorney, Agent, or Firm* — Tutunjian & Bitetto, P.C.; Louis J. Percello

(57) ABSTRACT

A method for forming nanowires includes forming a plurality of epitaxial layers on a substrate, the layers including alternating material layers with high and low Ge concentration and patterning the plurality of layers to form fins. The fins are etched to form recesses in low Ge concentration layers to form pillars between high Ge concentration layers. The pillars are converted to dielectric pillars. A conformal material is formed in the recesses and on the dielectric pillars. The high Ge concentration layers are condensed to form hexagonal Ge wires with (111) facets. The (111) facets are exposed to form nanowires.

6 Claims, 7 Drawing Sheets

(51) Int. Cl.
*H01L 29/10* (2006.01)
*H01L 29/16* (2006.01)
*H01L 29/04* (2006.01)
*H01L 29/78* (2006.01)

(56) References Cited

U.S. PATENT DOCUMENTS

| | | |
|---|---|---|
| 8,030,108 B1 * | 10/2011 | Lee .................. B82Y 10/00 257/E21.09 |
| 8,110,458 B2 | 2/2012 | Jin et al. |
| 8,115,191 B2 | 2/2012 | Cohen et al. |
| 8,269,209 B2 | 9/2012 | Shah et al. |
| 8,349,667 B2 | 1/2013 | Saracco et al. |
| 8,710,490 B2 | 4/2014 | Pillarisetty et al. |
| 8,883,573 B2 | 11/2014 | Shah et al. |
| 8,912,545 B2 | 12/2014 | Xiao et al. |
| 2010/0295024 A1 * | 11/2010 | Pernel .................. B82Y 10/00 257/24 |
| 2012/0138886 A1 * | 6/2012 | Kuhn .................. B82Y 10/00 257/9 |
| 2012/0199812 A1 | 8/2012 | Baykan et al. |
| 2013/0341704 A1 | 12/2013 | Rachmady et al. |
| 2014/0008604 A1 | 1/2014 | Wu et al. |
| 2014/0209855 A1 | 7/2014 | Cea et al. |
| 2015/0053928 A1 | 2/2015 | Ching et al. |
| 2015/0060767 A1 | 3/2015 | Xiao et al. |

OTHER PUBLICATIONS

Kuzum, D. et al., "Ge (100) and (111) N- and P-FETs With High Mobility and Low-T Mobility Characterization," IEEE Transactions on Electron Devices, vol. 56, No. 4, Apr. 2009. (pp. 648-655).
List of IBM Patents or Patent Applications Treated as Related dated Aug. 29, 2016, 2 pages.

* cited by examiner

STACKED STRAINED AND STRAIN-RELAXED HEXAGONAL NANOWIRES

BACKGROUND

Technical Field

The present invention relates to nanowires, and more particularly to methods and devices employing strained and unstrained Ge nanowires to improve carrier mobility.

Description of the Related Art

As technology node size decreases, scaling devices becomes increasingly difficult. For example, aggressive fin scaling can cause variation and mobility degradation in scaled down fin field effect transistors. At small technology node sizes, the scaling of fin technology is no longer possible without further architecture developments.

SUMMARY

A method for forming nanowires includes forming a plurality of epitaxial layers on a substrate, the layers including alternating material layers with high and low Ge concentration and patterning the plurality of layers to form fins. The fins are etched to form recesses in low Ge concentration layers to form pillars between high Ge concentration layers. The pillars are converted to dielectric pillars. A conformal material is formed in the recesses and on the dielectric pillars. The high Ge concentration layers are condensed to form hexagonal Ge wires with (111) facets. The (111) facets are exposed to form nanowires.

Another method for forming nanowires includes forming a plurality of epitaxial layers on a substrate, the layers including alternating material layers with high and low Ge concentration; patterning the plurality of layers to form fins; etching the fins to form recesses in low Ge concentration layers to form pillars between high Ge concentration layers; converting the pillars to dielectric pillars; forming a conformal material in the recesses and on the dielectric pillars; condensing the high Ge concentration layers to form hexagonal Ge wires with (111) facets; masking a first set of fins, which are strained, with a mask; etching a second set of fins that are not masked to remove the conformal material to relax the hexagonal Ge wires in the second set of fins and expose the (111) facets to form relaxed nanowires; removing the mask; and etching the first set of fins to expose the (111) facets to form strained nanowires.

A nanowire device includes stacked nanowires including hexagonal Ge wires with (111) facets exposed. Dielectric pillars connect the hexagonal Ge wires in at least a portion of the device. The (111) facets run parallel to a longitudinal direction of the nanowires to increase charge mobility of the nanowires.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
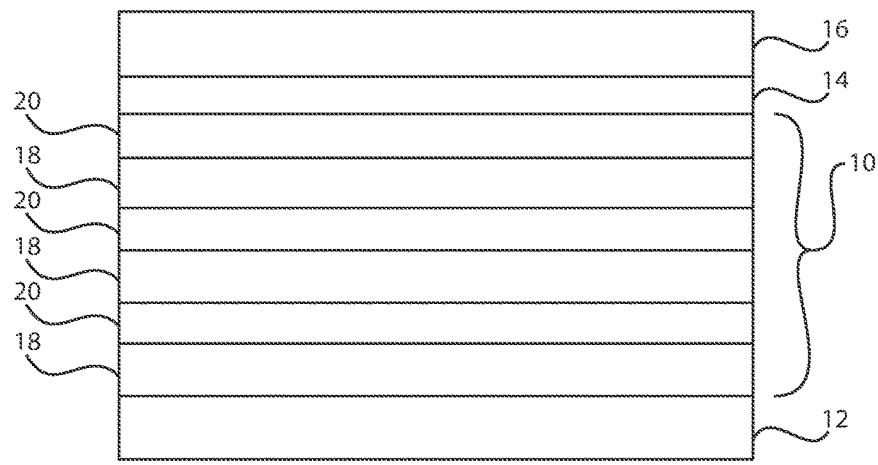
FIG. 1 is a cross-sectional view of a stack of alternating layers of different compositions on a substrate in accordance with the present principles.

In accordance with the present principles, a wrap-around nanowire architecture is described that can offer better electrostatics or similar electrostatics without the need for aggressive fin scaling, which can cause variation and mobility degradation. In one embodiment, structures and methods of fabrication include stacked hexagonal strained Ge nanowires with an oxide or oxide/nitride pillar in between the nanowires. In one embodiment, the stacked hexagonal strained Ge nanowires may be combined with stacked hexagonal relaxed Ge nanowires. The nanowires can be employed for complementary metal oxide semiconductor (CMOS) homogenous integration and may have applications for multiple threshold voltage (Vth) devices on a same chip due to the valence band differences between strained and relaxed Ge. The hexagonal nanowire shape permits the exposure of (111) planes which provides superior electron mobility. The stacked nanowire provides increased current per foot print combined with excellent electrostatics.

High mobility materials are attractive to improve transistor performance and can be combined with wrap around nanowires for use with CMOS technology. Uniaxial compressive strain is theoretically and experimentally shown to provide excellent p-type metal oxide semiconductor (PMOS) transport enhancement. In addition, relaxed germanium (Ge) with a (111) orientation can offer superior electron mobility over Si. Achieving such orientation in current fin field effect transistor (FET) or nanowire technology is not straightforward.

Stacked strained Ge nanowires can be employed in a PMOS region and offer the highest "hole" mobility (based on the experimental and theoretical data). Due to large asymmetric strain, the hole mobility is not orientation dependent. Stacked relaxed Ge nanowires can be used for n-type metal oxide semiconductor (NMOS) regions and offer superior electron mobility over Si. (111) dominant planes have the highest carrier mobility and specifically "electron" mobility. In one embodiment, stacked relaxed Ge nanowires can be employed for PMOS regions with higher absolute threshold voltage with respect to strained Ge nanowires, offering the possibility of multiple threshold voltages (Vth) for PFETs.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $SiGe_x$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a stack of layers 10 are illustratively shown on a substrate 12 in accordance with one illustrative embodiment. The stack of layers 10 illustratively include six layers; however a greater or lesser number of layers may be employed and processed in the same way as will be described. The substrate 12 may include a bulk substrate or a semiconductor-on-insulator (SOI) substrate. The substrate may include a monocrystalline Si, monocrystalline Ge, SiGe, or other suitable semiconductor material. The substrate 12 preferably includes a material and a structure suitable for epitaxial growth thereon.

Layers 10 include alternating layers 18 and 20 of different compositions of material. In one embodiment, layer 18 includes silicon or low Ge (e.g., less than 50%) SiGe, and layer 20 includes SiGe (about 50% Ge). The layers 10 are preferably monocrystalline. The layers 10 are formed by an epitaxial growth process on the substrate 12. A capping layer 14 is formed on the top of the layers 10. The capping layer may include a nitride material. A hard mask 16 is formed on the capping layer 14. The hardmask 16 may include an oxide.

Figure 2:
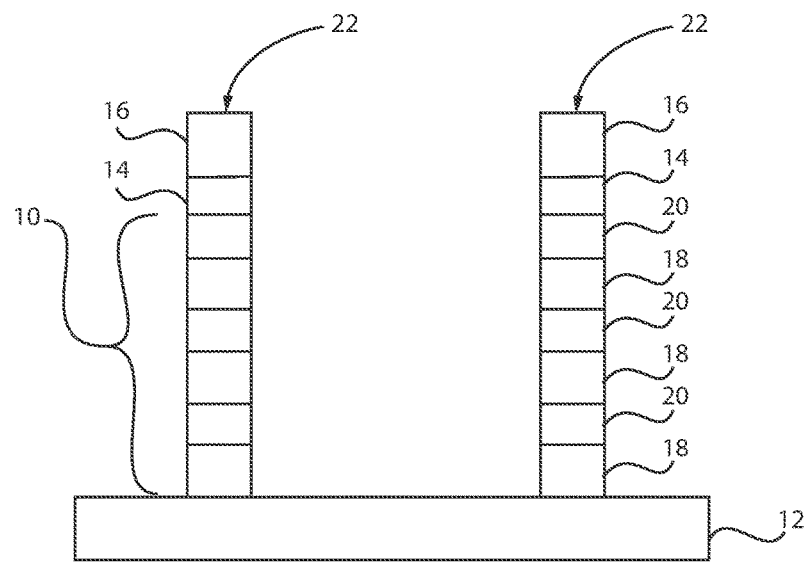
FIG. 2 is a cross-sectional view of the stack of FIG. 1 showing fins or pillars formed by patterning the layers down to the substrate in accordance with the present principles.

Referring to FIG. 2, fins or pillars 22 are formed by patterning the hardmask 16, capping layer 14 and layers 10 down to the substrate 12. The patterning may include lithographic processing and a reactive ion etch (RIE) or other anisotropic etching processes. The width of the fins may be about 10 nm to about 50 nm, and may have a considerable length (into or out of the page).

Figure 3:
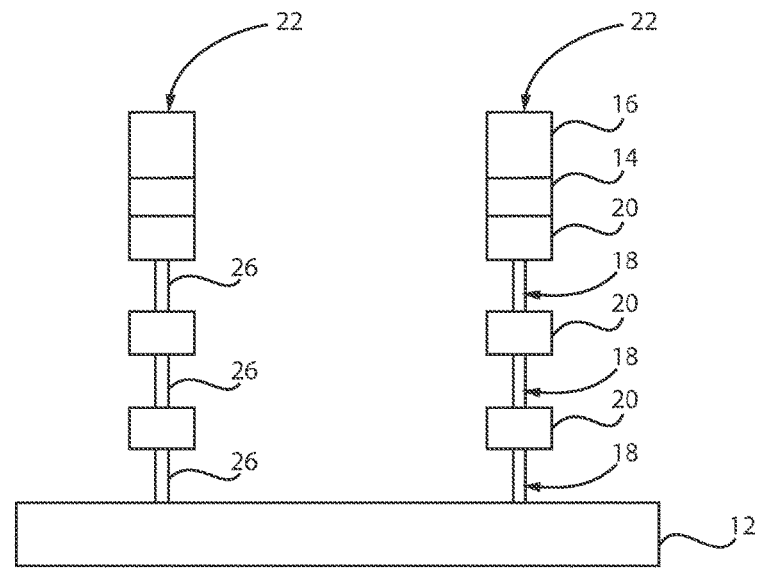
FIG. 3 is a cross-sectional view of the stack of FIG. 2 showing the fins subjected to an etch process that selectively etches one alternating layer relative to another in accordance with the present principles.

Referring to FIG. 3, the fins 22 are subjected to an etch process that selectively etches layers 18 relative to layers 20. The selective etch process may include a plasma etch or a wet etch. In one embodiment, the etch selectively etches layers 18 (e.g., Si, or low Ge doped Si) to recess the material or layers 18 to form pillars 26. Pillars 26 may include a width of, e.g., about 2 to 3 nm.

Figure 4:
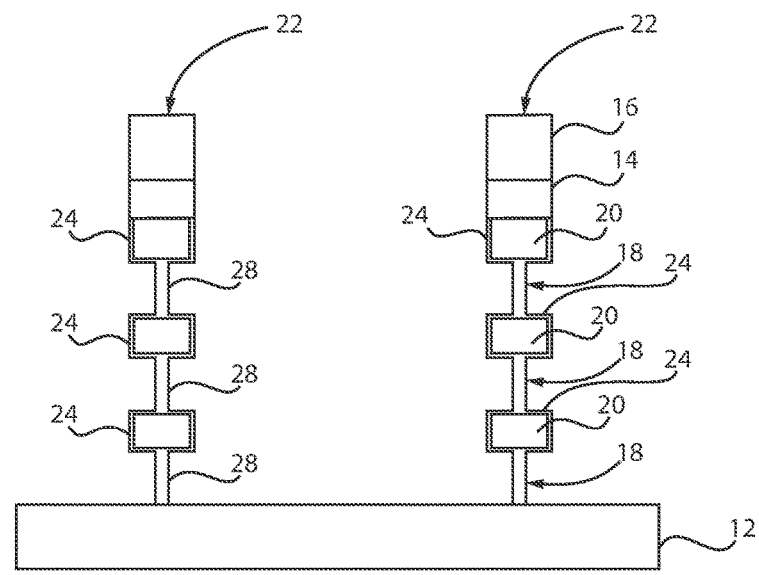
FIG. 4 is a cross-sectional view of the stack of FIG. 3 showing the fins subjected to a gentle oxidation process to form an oxide layer in accordance with the present principles.

Referring to FIG. 4, the fins 22 are subjected to a gentle oxidation process to form an oxide layer 24 on the layers 20 and to oxidize the pillars 26 to form pillars 28. The oxidation process may include a chemical or plasma oxidation to convert the narrow pillars 26 to a 4 to 5 nm oxide pillar 28. The oxide layer 24 may form a 1-2 nm thick oxide over the material of layer 20 (which may include, e.g., 50% SiGe).

Figure 5:
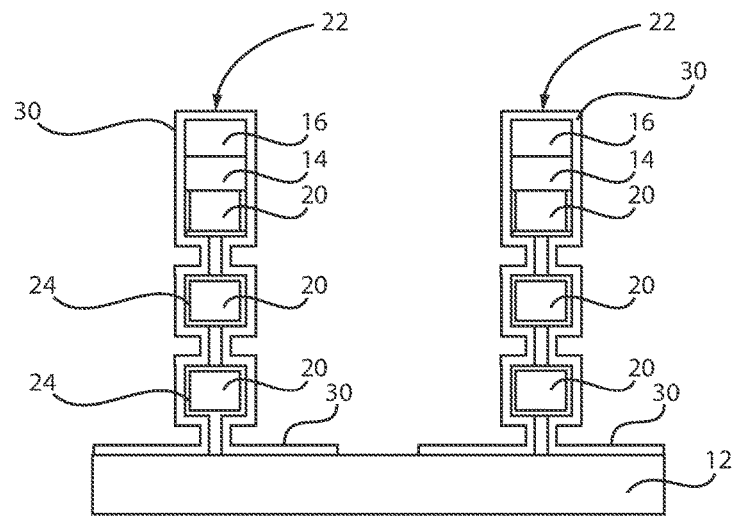
FIG. 5 is a cross-sectional view of the stack of FIG. 4 showing a conformal dielectric layer deposited over the fins in accordance with the present principles.

Referring to FIG. 5, a conformal dielectric layer 30 is deposited over the fins 22. The conformal dielectric layer 30 forms over all surfaces conformally including layers 20, pillars 28, hardmask 16, capping layer 14 and substrate 12. The conformal dielectric layer 30 may include a nitride, e.g., silicon nitride, e.g., $Si_3N_4$.

Figure 6:
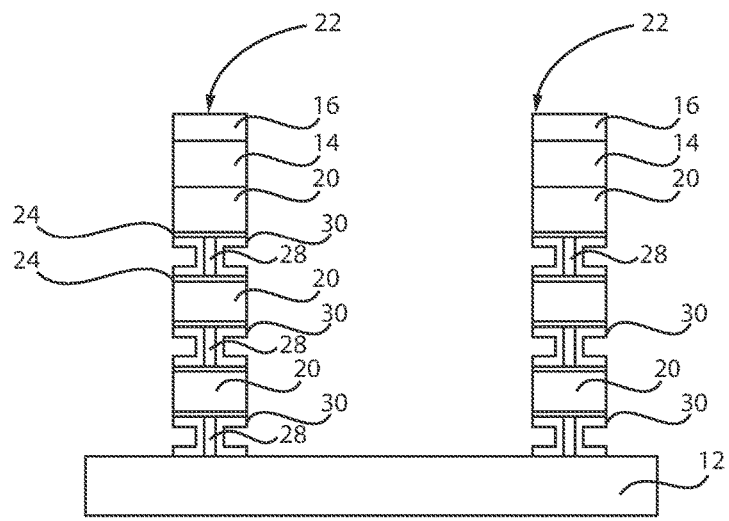
FIG. 6 is a cross-sectional view of the stack of FIG. 5 showing an anisotropic etch process to remove the conformal dielectric layer from lateral sides of the fins in accordance with the present principles.

Referring to FIG. 6, an anisotropic etch process is performed to remove the conformal dielectric layer 30 from lateral sides of the fins 22. This removes the conformal dielectric layer 30 from sides of layers 20, top and sides of the hardmask 16, sides of the capping layer 14 and the top of the substrate 12. The conformal dielectric layer 30 remains on the pillars 28 and in the recesses below layers 20. The anisotropic etch process may include a RIE. The etch process clears the conformal dielectric layer 30 on the sidewalls of the fin 22, etching nitride (layer 30) with a recess or erosion of the hardmask 16 and with a high selectivity, of, e.g., about 5 to about 10, to oxide. In one embodiment, assuming a 18 nm thickness (height) for each layer of the fin (22) stack, a 90 nm fin height with a selectivity of 6.8 would need at least 14 nm oxide for the hardmask 16. If the stack had 10 nm of nitride and a 20 nm oxide hard mask, at the end of the RIE, the nitride of layer 30 would be fully cleared from the sidewall of the fins 22.

Figure 7:
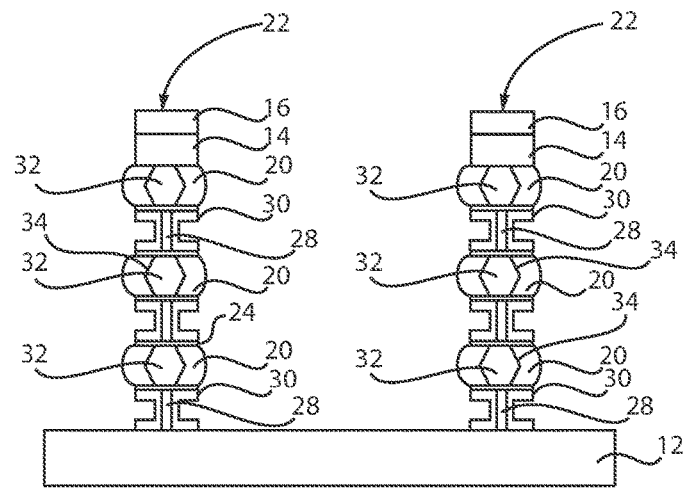
FIG. 7 is a cross-sectional view of the stack of FIG. 6 showing a condensation process performed to condense Ge in accordance with the present principles.

Referring to FIG. 7, a condensation process is performed to condense Ge within layer 20. The condensation process may include subjecting the fins 22 to a temperature of between about 800 degrees C. and 1050 degrees C. The condensation process diffuses the Ge in the layers 20 to form a strained Ge crystal hexagon 32 within the material of layer 20. The strained Ge hexagon 32 includes sides or surfaces 34 that are in the (111) plane. Other portions of layer 20 outside the Ge crystal hexagon 32 include Si and some Ge, which surround the Ge hexagon core 32.

Figure 8:
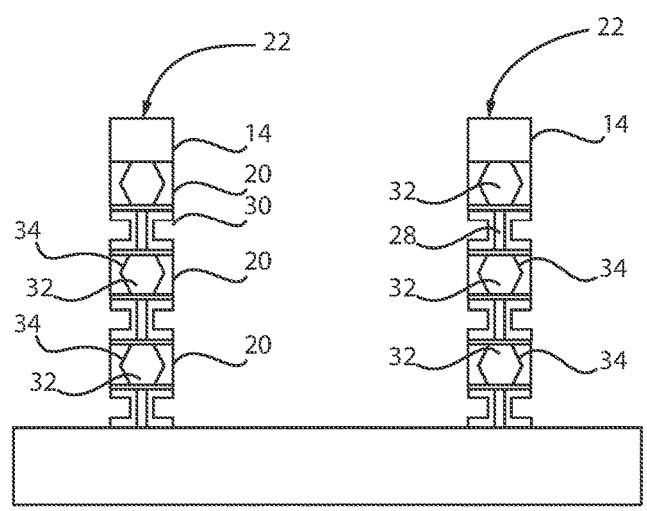
FIG. 8 is a cross-sectional view of the stack of FIG. 7 showing a reactive ion etch (RIE) to remove remnants of a hardmask from a capping layer in accordance with the present principles.

Referring to FIG. 8, a RIE process is performed to remove the remnants of the hardmask 16 from the capping layer 14. Capping layer 14 becomes exposed. This is performed to reduce etching budget for diluted HF (DHF) in the next steps.

Figure 9:
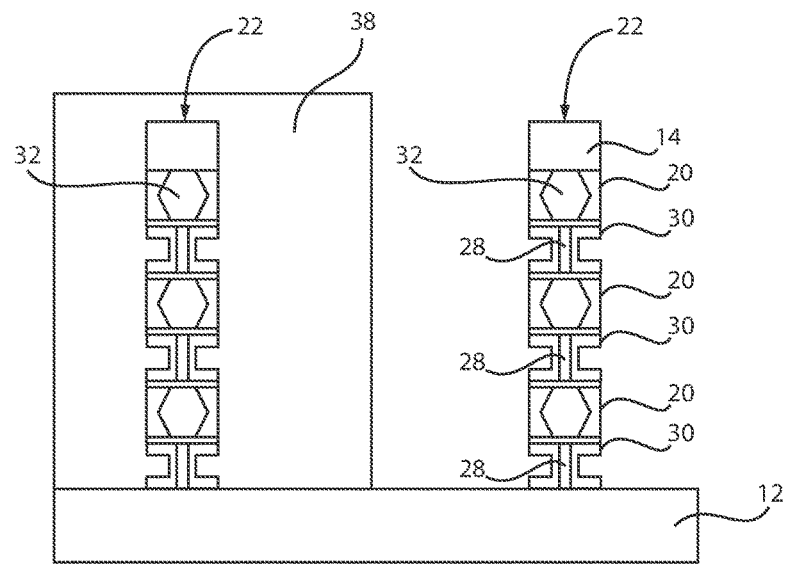
FIG. 9 is a cross-sectional view of the stack of FIG. 8 showing a blocking layer or mask formed and patterned to be removed from certain areas to expose fins in accordance with the present principles.

Referring to FIG. 9, a blocking layer or mask 38 is formed and patterned to be removed from certain areas to expose fins 22. The masked fins under the mask 38 will be protected from etching processes. The mask 38 may include a resist material or the like, which can be selectively removed relative to the materials of the fins 22. In one embodiment, the masked area under mask 38 may be designated for PFET devices while the exposed fins 22 may be designated for NFET devices. In other embodiments, the mask 38 may be employed to form devices of a same conductivity type (e.g., all PFETs all NFETs) or to provide different threshold voltages for the same or different conductivity type devices using nanowires with different properties.

Figure 10:
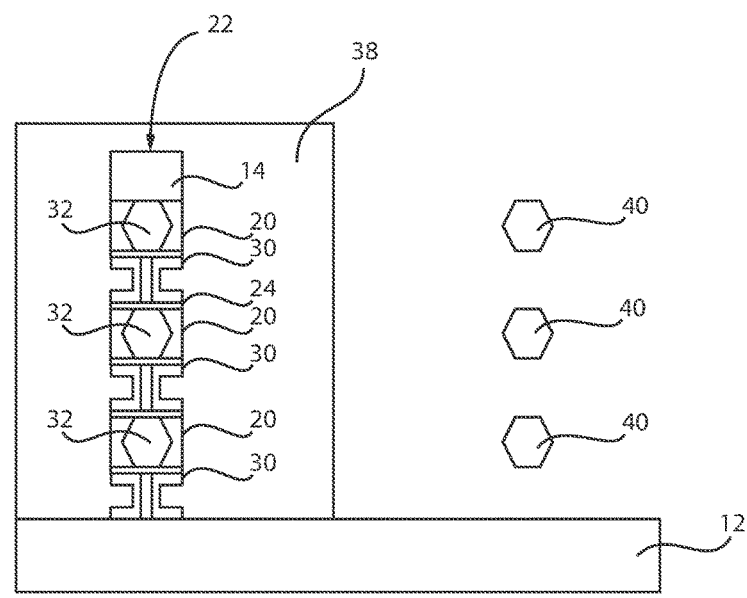
FIG. 10 is a cross-sectional view of the stack of FIG. 9 showing a wet etch performed to remove conformal dielectric, pillars, capping layers and portions of the layer outside of a Ge core in a channel region in accordance with the present principles.

Referring to FIG. 10, with the blocking layer or mask 38 in place, a wet etch is performed to remove the conformal dielectric 30, pillars 28, capping layer 14 and portions of the layer 20 outside of the Ge core (32). The Ge core forms nanowires 40. The wet etch may include a DHF etch or other suitable wet etch. The nanowires 40 are relaxed since the conformal dielectric layer 30 is removed. In one embodiment, the dielectric layer 30 includes SiN which is employed to hold the condensation-induced built-in strain in the Ge 32 in layer 20. With the removal of the dielectric layer 30, the nanowires 40 are relaxed. The nanowires 40 are supported intermittently over the length of the nanowires by support structures, which have a configuration as depicted in FIG. 8.

Figure 12:
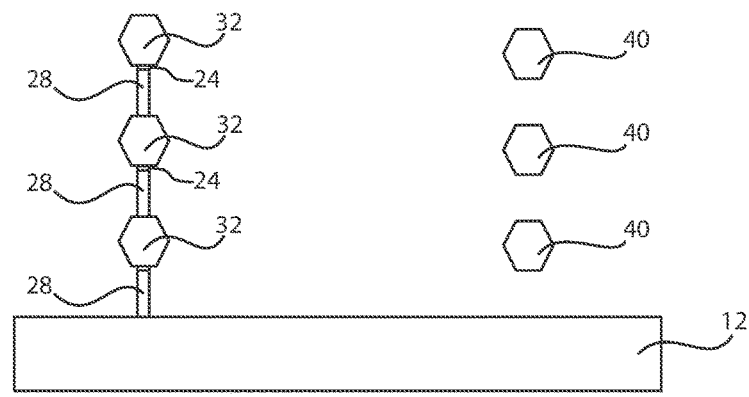
FIG. 12 is a cross-sectional view of the stack of FIG. 11 showing the dielectric layer selectively removed in accordance with the present principles.

The supporting structure is repeated every few lengths, such as, e.g., 1 to 5 multiples of the gate contacted pitch size, and has basically the same shape as FIG. 8. To suspend the nanowires 40, a lithography mask is employed to protect the support structures at intermittent distances along the nanowires 40. Then, nanowires 40 are released or partially released to reach the structure shown in FIG. 12. FIG. 12 is a cross section across a channel of the nanowires 40, and FIG. 8 shows the support structure that would intermittently exist. The nanowires 40 may be maintained over short lengths to prevent deformation. A length of around 40 to 200 nm (between support structures) may be employed, although longer lengths may also be used. The support structure can intermittently exist for nanowires 32 and may intermittently include the structure of FIG. 8 along the nanowires 32.

Figure 11:
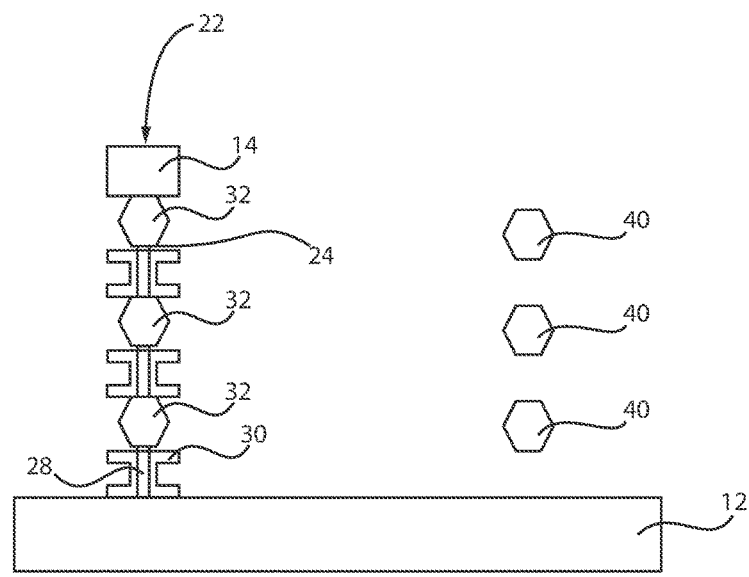
FIG. 11 is a cross-sectional view of the stack of FIG. 10 showing the blocking layer removed in accordance with the present principles.

Referring to FIG. 11, the blocking layer or mask 38 is removed. A selective etch is performed to remove portions of layer 20 leaving the Ge core or nanowires 32. The removal of the mask 38 and the portions of the layer 20 may be concurrently performed. The nanowires 32 and 40 may be employed at this stage to form transistor devices. The nanowires 32 include strained Ge and are suitable for form p-type devices, while the nanowires 40 are unstrained (relaxed) and are suitable for forming n-type devices. Since dielectric layer 30, which is strained, remains in the structure, the nanowires 32 are also strained.

Referring to FIG. 12, in another embodiment, processing may continue by selectively removing portions of the dielectric layer 30. The nanowires 32 remain strained due to the strained dielectric layer 30 portions. The nanowires 32 remain strained. In one embodiment, the lattice is compressively strained along the length of the nanowires 32. The pillar 28 in FIG. 7 maintains the strain. In the NFET, the pillar 28, and in particular dielectric layer 30, is removed and the nanowires 40 lose their compressive strain by elastic relaxation. If the suspension length is small, the nanowires do not distort.

The nanowires 32 and 40 may be employed at this stage to form transistor devices. The nanowires 32 include strained Ge and are suitable for form p-type devices, while the nanowires 40 are unstrained (relaxed) and are suitable for forming n-type devices. The nanowires 32, 40 may be employed as a channel for a field effect transistor (FET) device. Source and drain regions may be formed at ends of the nanowires and a gate may be formed along the nanowires to enable conduction therethrough. The nanowires 32, 40 include (111) surfaces (34) along which high charge mobility is obtained. The nanowires 32, 40 therefore provide higher mobilities than Si, SiGe, or bulk Ge.

Figure 13:
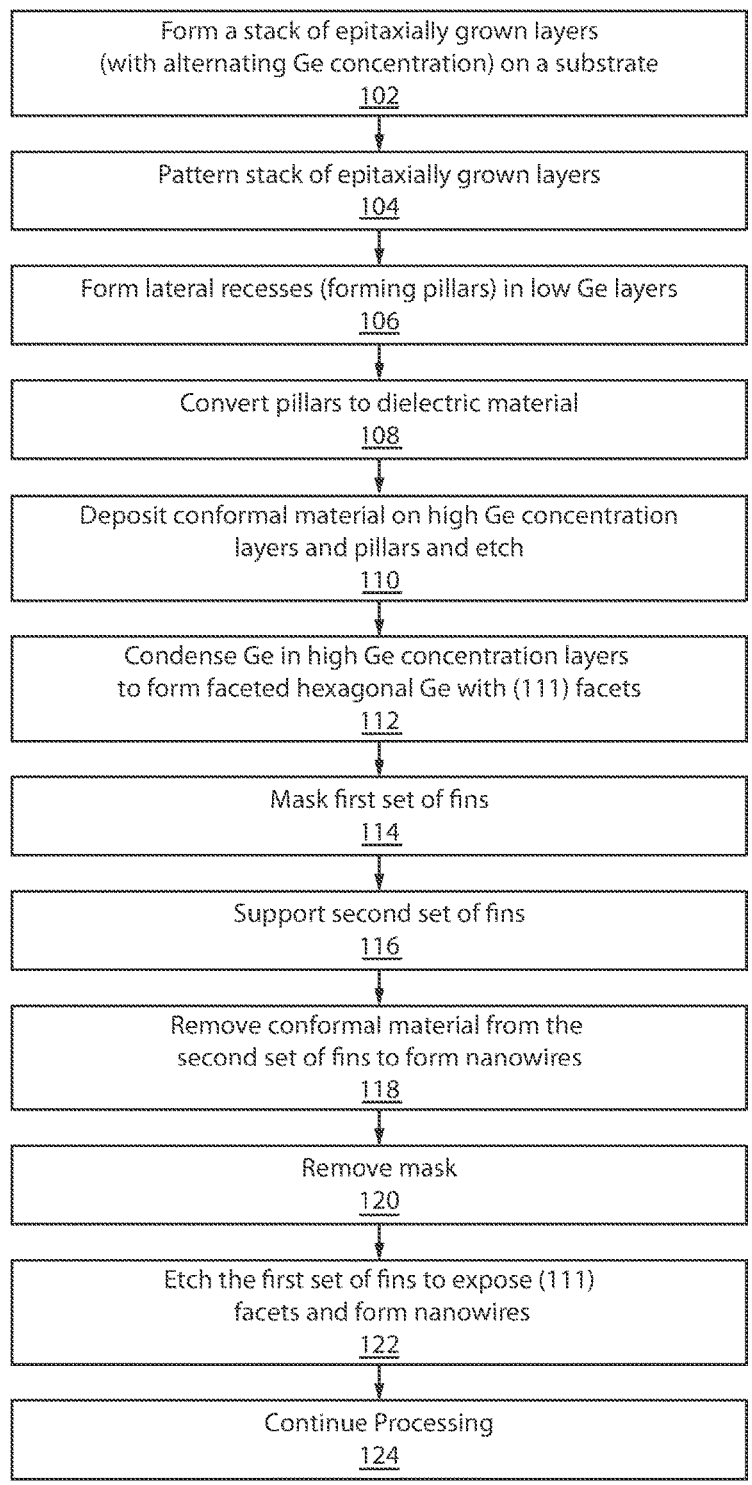
FIG. 13 is a block/flow diagram showing methods for forming nanowires in accordance with illustrative embodiments.

Referring to FIG. 13, a method for forming nanowires is illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a plurality of epitaxial layers is formed on a substrate. The layers include alternating material layers with high and low Ge concentration. In useful embodiments, the low concentration Ge layers include Si or SiGe with a Ge concentration less than about 50%, and the high concentration Ge layers include SiGe with a Ge concentration greater than about 50%. The layers are formed on a substrate preferably using epitaxial growth processes.

In block 104, the plurality of layers is patterned to form fins. This may include forming a hardmask and capping layer and performing lithographic processing including a RIE. In block 106, the fins are etched to form lateral recesses in low Ge concentration layers. The recesses form pillars connecting between high Ge concentration layers. In block 108, the pillars are converted to dielectric pillars, e.g., by performing an oxidation process. The pillars may include Si and the oxidizing forms a silicon oxide.

In block 110, a conformal material is deposited over the fins. The conformal material is removed from the sidewalls of the high Ge concentration layers using a selective RIE. The conformal material remains formed in the recesses and on the dielectric pillars. The conformal material may include silicon nitride and may be employed to induce strain (a stressor layer) into the high Ge concentration layers.

In block 112, the high Ge concentration layers are condensed to form hexagonal Ge wires with (111) facets. The condensation process includes applying a temperature of up to 1050 degrees C., e.g., the temperature may be between about 800 degrees C. and 1050 degrees C. The condensation process condenses Ge in a core of the material to form a hexagonal shapes with (111) facets.

In CMOS processing, NFETs and PFETs may be formed using nanowires. In other embodiments, multiple threshold voltage devices may be formed on the same device type using different nanowires. In block 114, a first set of fins, which are strained, are masked. The mask may include a resist or other material. The mask is patterned to divide the fins into at least two groups for separate processing. In block 116, a support structure may be provided to support one or more sets of fins.

In block 118, a second set of fins that are not masked are etched to remove the conformal material to relax the hexagonal Ge wires. The second set of fins have the (111) facets exposed by the etch to form strain relaxed nanowires. The strain relaxed and strained nanowires may be employed for PFETs and NFETs, respectively, or the relaxed and strained nanowires may be employed for different threshold voltage devices (e.g., of a same device conductivity type). The strained and strain-relaxed hexagonal nanowires are vertically stacked and may include any number of nanowires in the stack.

In block 120, the mask is removed. In block 122, the first set of fins is etched to expose the (111) facets to form strained nanowires. In block 124, processing continues with the formation of source and drain regions, gate structures, contacts, etc.

Having described preferred embodiments for stacked strained and strain-relaxed hexagonal nanowires (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A nanowire device, comprising:
stacked nanowires including hexagonal Ge wires with (111) facets exposed;
dielectric pillars connecting the hexagonal Ge wires in at least a portion of the device; and
the (111) facets running parallel to a longitudinal direction of the nanowires to increase charge mobility of the nanowires.

2. The device as recited in claim 1, wherein the hexagonal Ge wires includes strained nanowires and relaxed nanowires.

3. The device as recited in claim 2, further comprising:
a source region and a drain region formed at the ends of the nanowires; and
a gate formed on a channel region of the nanowire to enable conduction therethrough.

4. The device as recited in claim 2, wherein the strained nanowires provide a first threshold voltage, and the relaxed nanowires have a different second threshold voltage.

5. The device as recited in claim 1, wherein the pillars include silicon oxide and vertically connect adjacent hexagonal Ge wires.

6. The device as recited in claim 1, wherein the hexagonal Ge wires include a conformal nitride layer formed on a portion thereof to apply a strain to the hexagonal Ge wires.

\* \* \* \* \*